United States Patent [19]

Alaspa

[11] 4,446,390
[45] May 1, 1984

[54] LOW LEAKAGE CMOS ANALOG SWITCH CIRCUIT

[75] Inventor: Allan A. Alaspa, Austin, Tex.

[73] Assignee: Motorola, Inc., Schaumburg, Ill.

[21] Appl. No.: 334,992

[22] Filed: Dec. 28, 1981

[51] Int. Cl.³ .................... H03K 17/16; H03K 17/693
[52] U.S. Cl. .................................. 307/579; 307/243; 307/585; 328/104
[58] Field of Search .............. 307/443, 491, 494, 496, 307/497, 501, 242, 243, 250, 572, 577, 579, 583, 585, 352–353; 328/104, 154; 179/18 G, 18 GF; 340/825.91

[56] References Cited

U.S. PATENT DOCUMENTS

| | | | |
|---|---|---|---|
| 3,449,688 | 6/1969 | Broun | 307/577 |
| 3,521,141 | 7/1970 | Walton | 307/577 X |
| 3,524,996 | 8/1970 | Raper et al. | 307/577 |
| 3,558,921 | 1/1971 | Yokozawa et al. | 307/577 |
| 4,066,919 | 1/1978 | Huntington | 307/242 X |
| 4,156,153 | 5/1979 | Szechenyi | 179/18 GF X |

*Primary Examiner*—Larry N. Anagnos
*Assistant Examiner*—David R. Hudspeth
*Attorney, Agent, or Firm*—Anthony J. Sarli, Jr.; Jeffrey Van Myers; Robert Lee King

[57] ABSTRACT

A low leakage CMOS analog switch circuit comprising conventional MOS switches having transistors of high threshold voltages coupled to an interface circuit comprising transistors of low threshold voltages is provided. The N-channel threshold voltage of transistors in the switches is adjusted upward and the P-channel threshold voltage of transistors in the interface circuit is adjusted downward through the use of a single mask in one process step.

9 Claims, 3 Drawing Figures

LOW LEAKAGE CMOS ANALOG SWITCH CIRCUIT

TECHNICAL FIELD

This invention relates generally to analog switching circuits and, more particularly, to an analog switching circuit which has substantially no leakage currents and which is coupled to a circuit having low threshold voltage devices.

BACKGROUND ART

Generally, analog switching circuits comprise a plurality of parallel connected switches which couple a plurality of analog voltages to an interface circuit. The interface circuit may be coupled to a digital circuit having devices requiring low threshold voltages for high performance. A common source of error is caused by those analog switches which are disabled and which conduct a leakage current. A conventional CMOS analog switch comprises as a minimum two transistors of opposite conductivity type. The leakage currents result primarily from the transistors of the analog switch also having a low or normal threshold voltage. Due to process expediency, the threshold voltages of the transistors of the parallel coupled analog switches are typically the same as the threshold voltages of transistors in the interface and digital circuits. A partial solution to the leakage current problem has been to make the threshold voltage of all the transistors sufficiently high to prevent leakage. However, this is often unsatisfactory for high performance digital circuitry. An NMOS process which uses multiple implants to achieve multiple threshold voltages for preselected devices is shown in U.S. Pat. No. 4,033,026 to Pashley. However, the numerous process steps described therein often makes selective implanting undesirable.

BRIEF SUMMARY OF THE INVENTION

It is an object of the present invention to provide an improved low leakage analog switching circuit in integrated circuit form with a high performance interface circuit comprising devices with low threshold voltages.

Another object of the present invention is to provide a circuit having low leakage currents comprising a plurality of analog switches which are coupled to a high input impedance circuit comprising transistors having a low threshold voltage.

Yet another object of the present invention is to provide an improved analog switching circuit comprising devices having a high threshold voltage in integrated circuit form with a circuit comprising devices having a low threshold voltage and modifying all threshold voltages in one process step.

In carrying out the above and other objects and advantages of the present invention, there is provided, in one form, a plurality of analog switching means each comprising first and second transistors of opposite conductivity type and having a threshold voltage in a first range. Each switching means has an input which is coupled to one of a plurality of analog voltages. All switching means have the outputs thereof coupled together and to the input of an interface circuit comprising a plurality of transistors, each having a threshold voltage in a second range. By selective doping of transistors, the first range of threshold voltages is made substantially higher than the second range in a single process step.

The above and other objects, features and advantages of the present invention will be more clearly understood from the following detailed description taken in conjunction with the accompanying drawings.

DESCRIPTION OF THE PREFERRED EMBODIMENT

Figure 1:
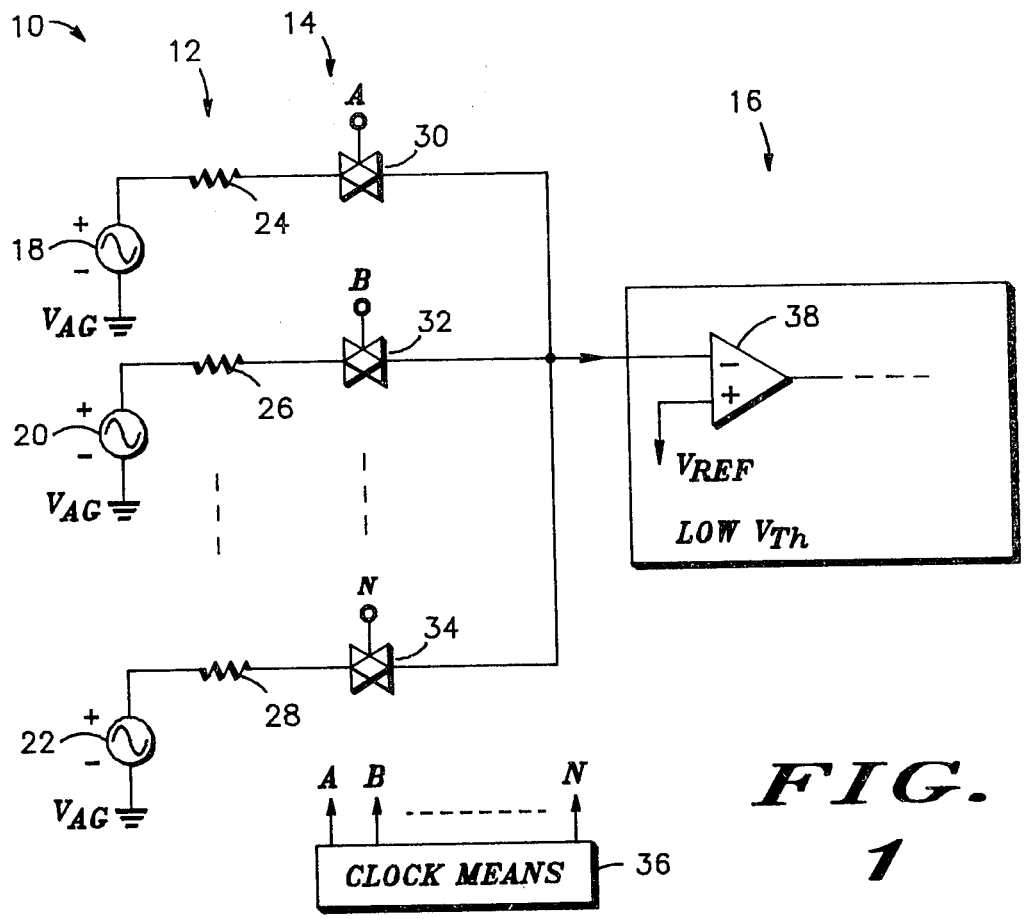
FIG. 1 illustrates in schematic form a low leakage analog switching circuit constructed in accordance with the preferred embodiment of the present invention.

Shown in FIG. 1 is a CMOS analog switch circuit 10 constructed in accordance with the preferred embodiment of the present invention. Analog switch circuit 10 is comprised generally of an analog input voltage portion 12, a switching portion 14 and an interface circuit portion 16. Analog input voltage portion 12 is comprised of a plurality of analog voltages represented in a Thevenin equivalent circuit model as voltage sources 18, 20 and 22 with each voltage source having a terminal coupled to a terminal of a respective equivalent series resistance represented as resistors 24, 26 and 28. Another terminal of each of voltage sources 18, 20 and 24 is coupled to an analog ground voltage, say $V_{AG}$. Resistor 24 has a terminal coupled to a terminal of a switch 30. Resistor 26 has a terminal coupled to a terminal of a switch 32, and resistor 28 has a terminal coupled to a terminal of a switch 34. Switches 30, 32 and 34 each have a terminal connected together and coupled to interface circuit 16. Switches 30, 32 and 34 are conventional MOS switches which are clocked in a conventional manner by signals A, B, ... N of clock means 36. It will be understood by those persons skilled in the art that CMOS transmission gates 30, 32 and 34 require two control signals. These two control signals are typically complements to each other. Additional analog input voltages and switches may be coupled in parallel as noted by the dashed lines of FIG. 1. In interface circuit portion 16, switches 30, 32 and 34 are coupled to an inverting or negative high impedance input of an operational amplifier 38 generally used for analog to digital conversion. A non-inverting or positive input of operational amplifier 38 is coupled to a reference voltage, $V_{REF}$. An output of operational amplifier 38 is coupled to additional circuitry (not shown) of interface circuit portion 16. Interface circuit portion 16 generally comprises transistors having a low threshold voltage. It should be apparent to one of ordinary skill that some predetermined transistors having a high threshold voltage may be desirable.

In operation, signals A, B, ... N usually only enable a predetermined one of the plurality of switches and the remaining switches are disabled. If the threshold voltage level of the transistors comprising switches 30, 32 and 34 are of a low or normal level of 0.4 volt to 0.8 volt, leakage currents may flow through those switches which are disabled to create an error voltage at the high impedance input of operational amplifier 38. Such leakage currents flow through the enabled switch to subtract from the analog input voltage generated by analog input voltage portion 12 which is being coupled to interface circuit 16. In typical analog systems there may be sixteen analog switches so that the potential for output voltage error is significant.

Figure 2:
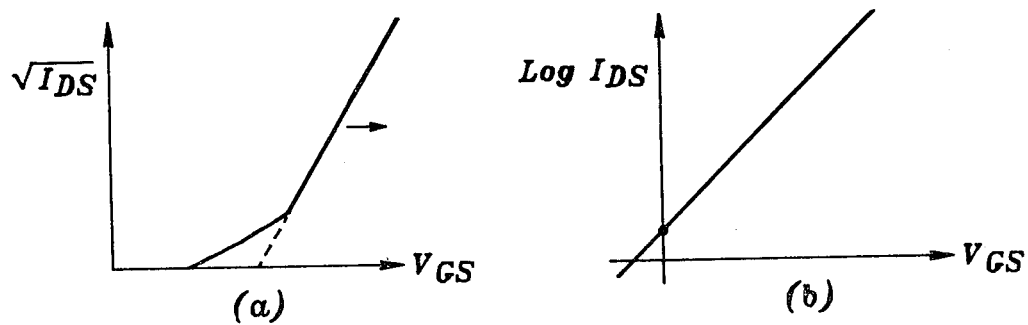
FIGS. 2(a) and 2(b) illustrate in graphical form the current-voltage relationships associated with a conventional analog switch.

Shown in FIG. 2(a) is a graphical relationship of the proportionality between the drain to source current of a conventional MOS transistor and its gate to source voltage. At low currents, the proportionality becomes nonlinear for sub-threshold voltages. In FIG. 2(b) when the sub-threshold effects are plotted on a logarithmic scale, when there is no gate to source voltage there exists a mathematically and physically real leakage current contribution. To reduce the significance of the leakage current, if the curve of FIG. 2(a) is shifted to the right by increasing the threshold voltage, say 0.1 volt, then the leakage current contribution is reduced by a factor of ten. However, the threshold voltage of all transistors cannot be uniformly raised without sacrificing the high performance of interface circuit 16.

This invention uses two different P and N-channel threshold voltages. Typically, the inherent P-channel threshold voltage of CMOS processes is approximately 1.26 volts and the inherent N-channel threshold voltage is approximately 0.6 volt. Implant doping during the semiconductor process is used in a conventional manner to vary these inherent levels. It will be understood by those skilled in the art that the threshold voltage of some transistors in a circuit can be varied while the threshold voltage of other transistors is left unchanged by the proper selection of masks. The preferred technique employed in the present invention is to adjust the P-channel threshold voltage of transistors in interface circuit portion 16 of switching circuit 10 downward and to adjust the N-channel threshold voltage of transistors in analog switch portion 12 of switching circuit 10 upward. In a preferred embodiment of the present invention, the threshold voltages of transistors in analog switch portion 14 are adjusted to be in a range between 1.1 and 1.5 volts, and the threshold voltages of transistors in interface circuit portion 16 are adjusted to be in a range betwen 0.4 and 0.8 volt.

In the instant circuit, four different sets of transistors exist. A first set is the set of N-channel devices within switches 30, 32, and 34. A second set is the set of N-channel devices within interface circuit portion 16. A third set is the set of P-channel devices within switches 30, 32 ad 34, and the fourth set is the set of P-channel devices within interface circuit portion 16. Again, high threshold voltages, $V_{THS}$, are desirable in switches 30, 32 and 34 and low threshold voltages are desirable in interface circuit portion 16.

Typically, N-channel devices have a $V_{TH}$ of between 0.4–0.8 volt, while P-channel devices have a $V_{TH}$ of 1.26 volts. While it is known in the prior art to adjust the threshold voltage of individual sets of transistors, several mask layers are usually required to adjust more than one set of transistors. However, by selecting the proper dopant, an N-channel threshold voltage can be raised and a P-channel threshold voltage can be lowered by exposing both devices to a single doping step.

In the instant invention, the N-channel devices of switches 30, 32 and 34 and the P-channel devices of interface circuit portion 16 are exposed via one mask layer, i.e., the N-channel devices of interface circuit portion 16 and the P-channel devices of switches 30, 32 and 34 are not exposed to a dopant. The dopant dosage is selected such that the threshold voltage of the N-channel devices of gates 30, 32 and 34 are raised (by, say 0.7 V), which is desirable in order to reduce leakage; the P-channel devices of gates 30, 32 and 34 are masked out so that the threshold voltage remains high (say, 1.26 V); and the threshold voltage of the exposed P-channel devices in interface circuit portion 16 is lowered (by say, 0.7 V), which is desirable for high perforance. The threshold voltage of the N-channel devices of interface circuit portion 16 remains low since the mask layer does not expose them to the dopant. Therefore, a solution to the leakage problem exists without having to raise the threshold voltages of the transistors in interface circuit portion 16. In the preferred embodiment, the top of the low range (0.4–0.8 V) should be lower than the bottom of the high range (1.1–1.5 V).

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A low leakage CMOS analog switch circuit comprising:
    a plurality of switching means, each of which is coupled to a predetermined one of a plurality of control signals and each having first and second transistors of first and second conductivity types having a threshold voltage in a first range, each of which has an input coupled to a predetermined one of a plurality of analog input voltages, and all of which have an output coupled together, wherein a predetermined one of said analog input voltages is selectively coupled to the output in response to a predetermined one of the plurality of control signals; and
    an interface circuit having an input coupled to the output of said plurality of switching means, comprising a plurality of transistors, each having a threshold voltage in a second range having voltages less than voltages of the first range, said interface circuit providing an interface to circuitry having low voltage thresholds.

2. A low leakage CMOS switch circuit comprising:
    a plurality of switching means, each comprising first and second transistors of first and second conductivity types and having a threshold voltage in a first range substantially between 1.1 and 1.5 volts, each of said switching means having an input coupled to a predetermined one of a plurality of analog input voltages, and all switching means having the outputs thereof coupled together, wherein a predetermined one of the plurality of analog input voltages is selectively coupled to the coupled outputs in response to a predetermined one of a plurality of control voltages; and
    an interface circuit having an input coupled to the outputs of said plurality of switching means, comprising a plurality of transistors, each having a threshold voltage in a second range having voltages less than voltages of the first range of threshold voltages, said interface circuit providing an interface to circuitry having low voltage thresholds.

3. A low leakage CMOS switch circuit comprising:
    a plurality of switching means, each comprising first and second transistors of first and second conductivity types and having a threshold voltage in a first range, each of said switching means having an input coupled to a predetermined one of a plurality of analog input voltages, and all switching means having the outputs thereof coupled together, wherein a predetermined one of the plurality of analog input voltages is selectively coupled to the coupled outputs in response to a predetermined one of a plurality of control voltages; and an interface circuit having an input coupled to the outputs of said plurality of switching means, having a plurality of transistors, each having a threshold voltage in a second range which contains voltages less than voltages of the first range and substantially between 0.4 and 0.8 volt, said interface circuit providing an interface to circuitry having low voltage thresholds.

4. A low leakage CMOS switching circuit capable of switching a plurality of analog voltages to a receiving circuit having low threshold transistors, wherein the CMOS switching circuit comprises:

a plurality of switching means, each having first and second transistors of first and second conductivity, respectively, said first and second transistors having a threshold of a higher voltage than the low threshold transistors in the receiving circuit so that leakage currents are greatly reduced, each of said switching means selectively coupling a predetermined one of the plurality of analog voltages to the receiving circuit in response to a predetermined one of a plurality of control signals.

5. The low leakage CMOS switching circuit of claim 4 wherein the receiving circuit has a high input impedance.

6. The low leakage CMOS analog switch circuit of claim 1 further comprising:

clock means for providing the plurality of control signals.

7. The low leakage CMOS analog switch circuit of claim 2 further comprising:

clock means for providing the plurality of control signals.

8. The low leakage CMOS switching circuit of claim 3 further comprising:

clock means for providing the plurality of control signals.

9. The low leakage CMOS switching circuit of claim 4 further comprising:

clock means for providing the plurality of control signals.

* * * * *